(12) United States Patent
Lim et al.

(10) Patent No.: US 11,445,608 B2
(45) Date of Patent: Sep. 13, 2022

(54) CHASSIS INTERCONNECT FOR AN ELECTRONIC DEVICE

(71) Applicant: Intel Corporation, Santa Clara, CA (US)

(72) Inventors: Chee How Lim, Hillsboro, OR (US); Eng Huat Goh, Penang (MY); Jon Sern Lim, Jelutong (MY); Khai Ern See, Batu Gajah (MY); Min Suet Lim, Simpang Ampat (MY); Tin Poay Chuah, Bayan Lepas (MY); Yew San Lim, Penang (MY)

(73) Assignee: Intel Corporation, Santa Clara, CA (US)

( * ) Notice: Subject to any disclaimer, the term of this patent is extended or adjusted under 35 U.S.C. 154(b) by 267 days.

(21) Appl. No.: 16/903,845

(22) Filed: Jun. 17, 2020

(65) Prior Publication Data

US 2021/0100101 A1 Apr. 1, 2021

(30) Foreign Application Priority Data

Sep. 30, 2019 (MY) .......................... PI 2019005754

(51) Int. Cl.
*H05K 1/14* (2006.01)
*H01R 12/61* (2011.01)
*H05K 1/11* (2006.01)

(52) U.S. Cl.
CPC ........... *H05K 1/141* (2013.01); *H01R 12/613* (2013.01); *H05K 1/117* (2013.01)

(58) Field of Classification Search
CPC ....... H05K 1/141; H05K 1/117; H01R 12/613
USPC ......................................................... 361/736
See application file for complete search history.

(56) References Cited

U.S. PATENT DOCUMENTS

| 2001/0020545 A1* | 9/2001 | Eldridge ............ H01L 25/0652 257/E21.507 |
| 2005/0047730 A1* | 3/2005 | Ellison ................. G02B 6/4292 385/92 |

* cited by examiner

*Primary Examiner* — Andargie M Aychillhum
(74) *Attorney, Agent, or Firm* — Schwegman Lundberg & Woessner, P.A.

(57) ABSTRACT

An electronic device may include a chassis. The electronic device may include a first electronic component that may include a first substrate and a first interconnect. The electronic device may include a second electronic component that may include a second substrate and a second interconnect. The second substrate may be physically separated from the first substrate. An electrical trace may be coupled to the chassis of the electronic device. The electrical trace may be sized and shaped to interface with the first interconnect of the first electronic component. The electrical trace may be sized and shaped to interface with the second interconnect of the second electronic component. The first electronic component and the second electronic component may be in electrical communication through the electrical trace coupled to the chassis of the electronic device.

21 Claims, 6 Drawing Sheets

CHASSIS INTERCONNECT FOR AN ELECTRONIC DEVICE

PRIORITY

This patent application claims the benefit of priority to Malaysia Application Serial No. PI 2019005754, filed Sep. 30, 2019, which is incorporated by reference herein in its entirety.

TECHNICAL FIELD

This document pertains generally, but not by way of limitation, to an electrical interconnect for an electronic device.

BACKGROUND

An electronic device may include a first electronic component (e.g., a motherboard) and a second electronic component (e.g., circuitry for a camera). The first electronic component may be electrically interconnected with the second electronic component. For example, a cable (e.g., a ribbon cable, flexible cable, or the like) may be coupled to the first electronic component and the second electronic component. The cable may facilitate electrical communication between the electronic components.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
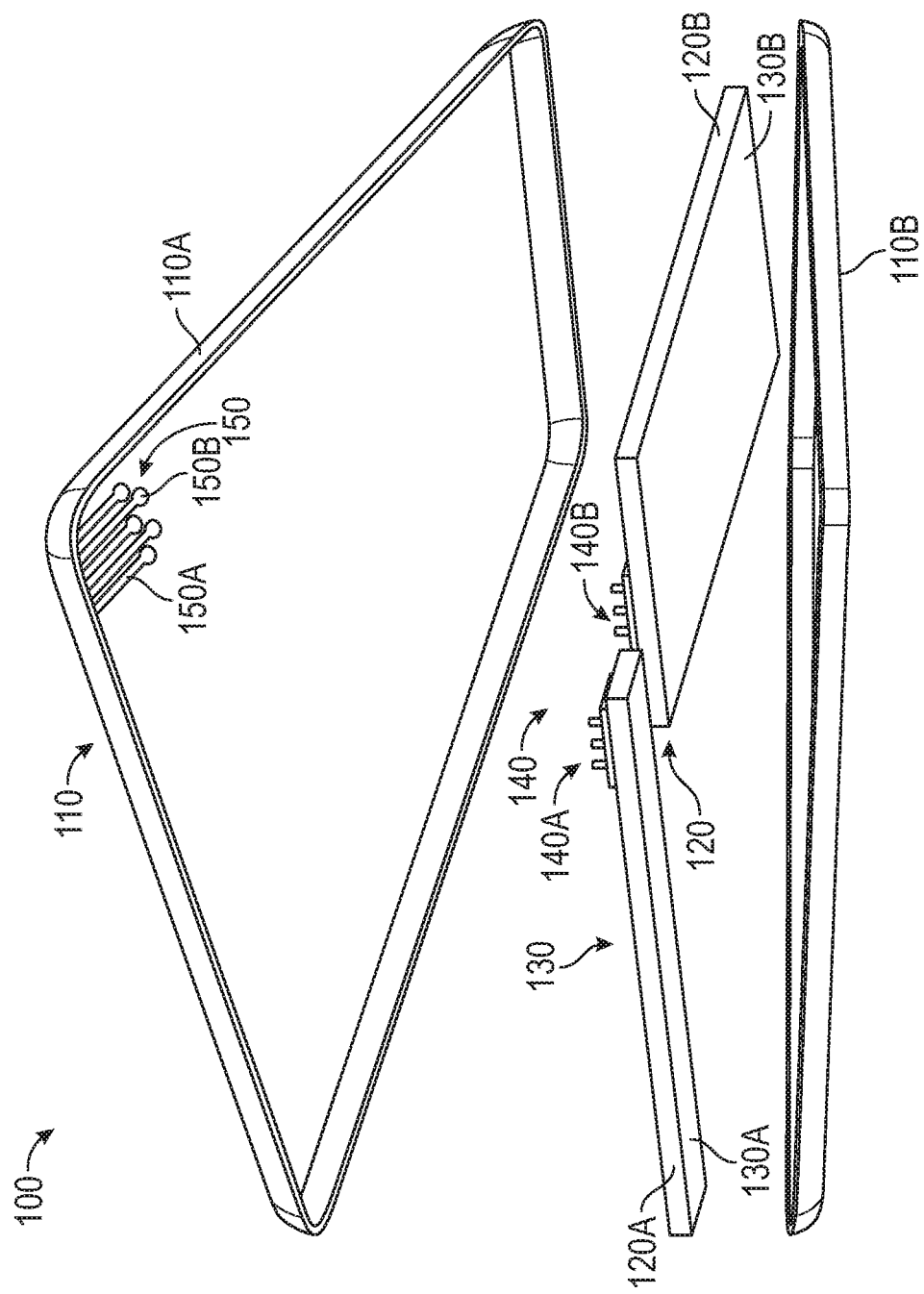
FIG. 1 illustrates an exploded view of an example of an electronic device, according to an embodiment of the present subject matter.

The present inventors have recognized, among other things, that a problem to be solved may include electrically interconnecting electronic components that are physically separated from each other. For example, a gap may be located between a first electronic component (e.g., a motherboard) having a first substrate (e.g., circuit board, or the like) and a second electronic component (e.g., a camera, a battery, input device, or the like) having a second substrate. Space constraints within the electronic device may increase the difficulty of transmitting an electrical signal between the electronic components. For instance, the tolerance between components of the electronic device may inhibit routing a cable between the first electronic component and the second electronic component.

The present subject matter may help provide a solution to this problem, such as by providing an electronic device including a chassis (e.g., a frame, housing, case, shell, lid, enclosure or the like). The electronic device may include a first electronic component that may include a first interconnect and may include a first substrate. The electronic device may include a second electronic component that may include a second interconnect and may include a second substrate. The second substrate may be physically separated (e.g., a separate component, detached from, or the like) from the first substrate.

The electronic device may include an electrical trace, and the electrical trace may be coupled to the chassis of the electronic device. The electrical trace may be sized and shaped to interface with the first interconnect of the first electronic component and to interface with the second interconnect of the second electronic component (e.g., when one or more of the electronic components is coupled to the chassis). The first electronic component and the second electronic component may be in electrical communication through the electrical trace that is coupled to the chassis of the electronic device. For example, the electrical trace may facilitate the transmission of one or more electrical signals (e.g., an analog signal, a digital signal, or a combination thereof) between the first electronic component and the second electronic component.

The electrical trace coupled to the chassis may facilitate reducing the dimensions of the electronic device. In an example, the electrical trace coupled to the chassis may facilitate transmitting electrical signals between components of the electronic device where it would be difficult (or impossible) to route a cable between the electronic components without increasing the dimensions of the electronic device (e.g., by increasing a width of the chassis to accommodate the cable). In some examples, the electrical trace may facilitate making the electronic device more compact. For instance, the electrical trace may facilitate locating electronic components closer together within the electronic device, thereby increasing the density of the components within the electronic device. Increasing the density of the components within the electronic device may allow for a reduction in the overall dimensions (e.g., size, or the like) of the electronic device. Increasing the density of the components within the electronic device may improve the performance of the electronic device, for instance by allowing for an increase in the size of a battery within the electronic device and thereby improving the battery life of the electronic device while maintaining the overall dimensions of the electronic device.

This overview is intended to provide an overview of subject matter of the present patent application. This overview is not intended to provide an exclusive or exhaustive explanation of the invention. The detailed description continues and provides further information about the present patent application.

FIG. 1 illustrates an exploded view of an example of an electronic device 100, according to an embodiment of the present subject matter. The electronic device 100 may include a chassis 110 (e.g., a frame, case, housing, lid, shell, enclosure, or the like). The chassis 110 may include one or more components, for example a first chassis component 110A and a second chassis component 110B. In some examples, the second chassis component 110B may be selectively attachable to the first chassis component 110A. For example, the chassis components 110A, 110B may be assembled together to provide the chassis 110. The chassis 110 may include a polymeric material, a metallic material, or the like.

The electronic device 100 may include one or more electronic components 120, for instance a first electronic component 120A and a second electronic component 120B. The chassis 110 may be sized and shaped to enclose one or more of the electronic components 120. The electronic components 120 may include (but is not limited to) one or more of a semiconductor device (e.g., a die, processor, or the like), a motherboard, a daughter card, a camera, a network interface device (e.g., radio, antenna, or the like), a battery, a display, an input device (e.g., a touchpad, keyboard, touchscreen, passive electrical component (including, but not limited to, a resistor, capacitor, and inductor), or the like. The electronic components 120 may help facilitate one or more functions of the electronic device 100, for example allowing a user to place a telephone call, observe a website, or the like.

The electronic components 120 may include one or more substrates 130. For example, the first electronic component 120A may include a first substrate 130A, and the second electronic component 120B may include a second substrate 130B. The substrates 130 may support one or more portions of the electronic component 120. For example, a first passive electrical component (e.g., a capacitor) and a semiconductor die may be couple to the first electronic component 120A. A second passive electrical component (e.g., a capacitor) and a semiconductor die may be couple to the first electronic component 120A.

One or more interconnects 140 (e.g., a pin, pad, contact, pogo pin, fuzz button. PC beam, or the like) may be included in the electronic components 120. For example, a first set of interconnects 140A may be coupled to substrate 130A. A second set of interconnects 140B may be coupled to the substrate 130B. The interconnects 140 may help facilitate the electrical communication of the electronic components 120.

In an example, the electronic device 100 may include one or more electrical traces 150, for instance a first electrical trace 150A spaced apart from a second electrical trace 150B. The electrical traces 150 may interface with the interconnects 140 and the electrical traces 150 may help facilitate the electrical communication between the electronic components 120, for instance when the electronic components are physically separated (e.g., by a gap, space, void, distance, or the like). For example, the electrical traces 150 may facilitate the transmission of one or more electrical signals (e.g., an analog signal, a digital signal, or a combination thereof) between the first electronic component 120A and the second electronic component 120B. The electrical traces 150 may be spaced at a first pitch. The electrical traces 150 may be spaced at a second pitch. The electrical traces 150 may have an irregular pitch (e.g., a combination of the first pitch and the second pitch).

As described in greater detail herein, the electrical traces 150 may be coupled to the chassis 110, for example one or more of the first chassis component 110A and the second chassis component 110B. The electrical traces 150 that are coupled to the chassis 110 may facilitate the transmission of electrical signals between the electronic components 120. Accordingly, the electrical traces 150 may be included in an electrical circuit, for example an electrical circuit that includes the electronic components 120.

Referring again to FIG. 1, and as described herein, the second chassis component 110B may be selectively attachable to the first chassis component 110A. In some examples, the electrical traces 150 may interface with the interconnects 140 (e.g., interconnects 140A, 140B) when the second chassis component is attached to the first chassis component 110A. For example, one or more of the electronic components 120 (e.g., the components 120A, 120B) may be coupled to the chassis 110, for example coupled to the second chassis component 110B. The electrical traces 150 may be coupled to the first chassis component 110A. The electrical traces 150 may be sized and shaped (and otherwise located to) interface with the interconnects 140 when the second chassis component 110B is attached to the first chassis component 110A. For example, the first electronic component 120A may be in electrical communication with the second electronic component 120B when the chassis component 110B is attached to the chassis component 110A.

Figure 2:
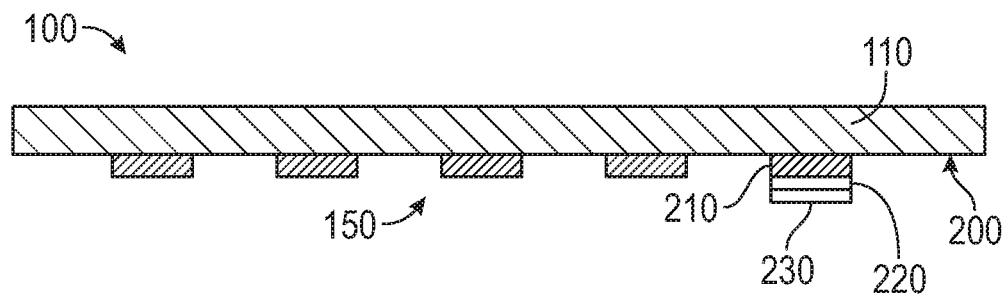
FIG. 2 illustrates a side view of an example of a chassis, according to an embodiment of the present subject matter.

FIG. 2 illustrates a side view of an example of the chassis 110, according to an embodiment of the present subject matter. As described herein, the electronic device 100 may include the one or more (e.g., a plurality of) electrical traces 150. The one or more electrical traces 150 may be coupled to the chassis 110, for instance to a surface 200 of the chassis 110. The electrical traces may extend (e.g., project, protrude, or the like) from the surface 200 of the chassis 150.

In an example, the traces are coupled to the chassis 110 with a laser direct structuring operation, a plating operation (e.g., electroplating a conductive material onto the chassis 110), an etching operation (e.g., selectively etching a copper material to define the traces 150), a metallization operation, additive manufacturing operation, or the like. In an example, the electrical traces 150 may include a conductive material (e.g., copper, nickel, gold, or the like), and the conductive material may be coupled to the chassis 110 with a specified pattern (e.g., a linear electrical trace, a curved electrical trace, an electrical trace including one or more bends, or the like). For example, the electrical trace 150 may be sized and shaped to interface with the interconnects 140 of the electronic components 120 (e.g., the first set of interconnects 140A and the second set of interconnects 140B, shown in FIG. 1).

In some examples, the electrical traces 150 may include a first conductive layer 210, and the first conductive layer 210 may be coupled to the chassis 110. The first conductive layer 210 may include (but is not limited to) copper. The electrical traces 150 may include a second conductive layer 220, and the second conductive layer 220 may be coupled to the first conductive layer 210. The second conductive layer 220 may improve the mechanical performance of the electrical traces 150. For instance, the second conductive layer 220 may include (but is not limited to) nickel, and the second conductive layer 220 may increase the hardness of the electrical traces 150. The electrical traces 150 may include a third conductive layer 230, and the third conductive layer 230 may be coupled to the first conductive layer 210 or the second conductive layer 220. The third conductive layer 230 may improve the electrical performance of the electrical traces 150. For instance, the third conductive layer 230 may include (but is not limited to) gold, and the third conductive layer 230 may inhibit surface oxidation of the electrical traces 150.

Figure 3:
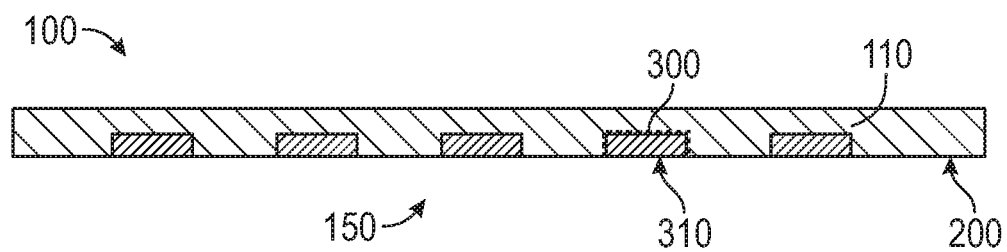
FIG. 3 illustrates a side view of another example of the chassis, according to an embodiment of the present subject matter.

FIG. 3 illustrates a side view of another example of the chassis 110, according to an embodiment of the present subject matter. As described herein, the electrical traces 150 may extend from the surface 200 of the chassis 110. In some examples, the electrical traces 150 may be recessed within a portion of the chassis 110. For example, the chassis 110 may define a channel 300, and the electrical traces 150 may be located within the channel 300. A trace surface 310 of the electrical traces 150 may be coplanar with the surface 200 of the chassis 110.

Figure 4:
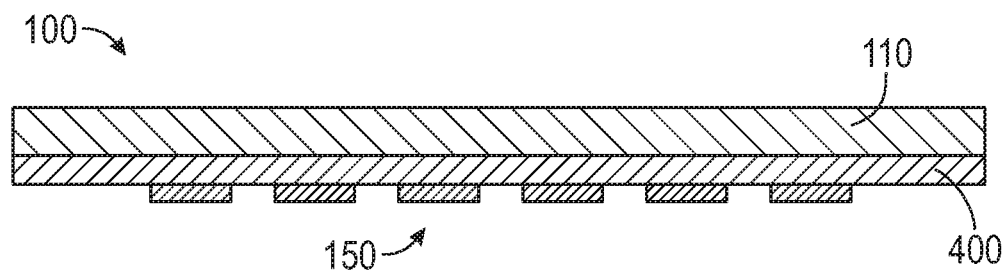
FIG. 4 illustrates a side view of yet another example of the chassis, according to an embodiment of the present subject matter.

FIG. 4 illustrates a side view of yet another example of the chassis 110, according to an embodiment of the present subject matter. In some examples, a dielectric layer 400 (e.g., liquid crystal polymer, or the like) may be coupled to the chassis 110. In some examples, the chassis 110 may include an electrically conductive material (e.g., aluminum, steel, or the like). The dielectric layer 400 may electrically isolate the electrical traces 150 from the chassis 110. The dielectric layer 400 may electrically isolate individual ones of the electrical traces 150 (e.g., the trace 150A) from other ones of the electrical traces 150 (e.g., the trace 150B). The dielectric layer 400 may increase the signal integrity of electrical signals transmitted by the electrical traces 150. For instance, the dielectric layer 400 may be coupled to the chassis 110, and the electrical traces 150 may be coupled to the dielectric layer 400. The dielectric layer 400 may help reduce the amount of loss or noise that affects the electrical signals transmitted by the electrical traces 150. Accordingly, the dielectric layer 400 may help improve the performance of the electronic device 100.

Figure 5:
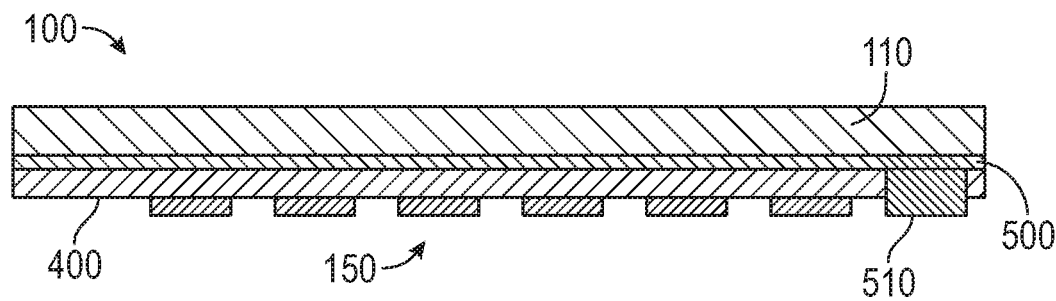
FIG. 5 illustrates a side view of still yet another example of the chassis, according to an embodiment of the present subject matter.

FIG. 5 illustrates a side view of still yet another example of the chassis 110, according to an embodiment of the present subject matter. The electronic device 100 may include a metallic layer 500. The metallic layer 500 may be coupled to the chassis 110. As described in greater detail herein, the metallic layer 500 may be in electrical communication with a reference plane (e.g., an electrical plane having a specified electrical characteristic, for instance a ground, a reference voltage, reference resistance, reference capacitance, or the like). For example, the electronic device 100 may include a reference interconnect 510, and the reference interconnect may extend through the dielectric layer 400. The reference interconnect 510 may be in electrical communication with the metallic layer 500, and the reference interconnect 510 may allow for the transmission of electrical signals to (and reception of electrical signals from) the metallic layer 500. The metallic layer 500 may include (but is not limited to) copper, nickel, gold, or the like.

The metallic layer 500 may help improve the transmission of high-speed electrical signals by the electrical traces 150. The dielectric layer 400 may be coupled to the metallic layer 500. The metallic layer 500 may be located between the dielectric layer 400 and the chassis 110. The dielectric layer 400 may be located between the electrical traces 150 and the metallic layer 500. The metallic layer 500 may provide signal referencing and may provide impedance control to the electrical traces 150. Accordingly, metallic layer 500 may help improve the transmission of high-speed electrical signals by the electrical traces 150.

Figure 6:
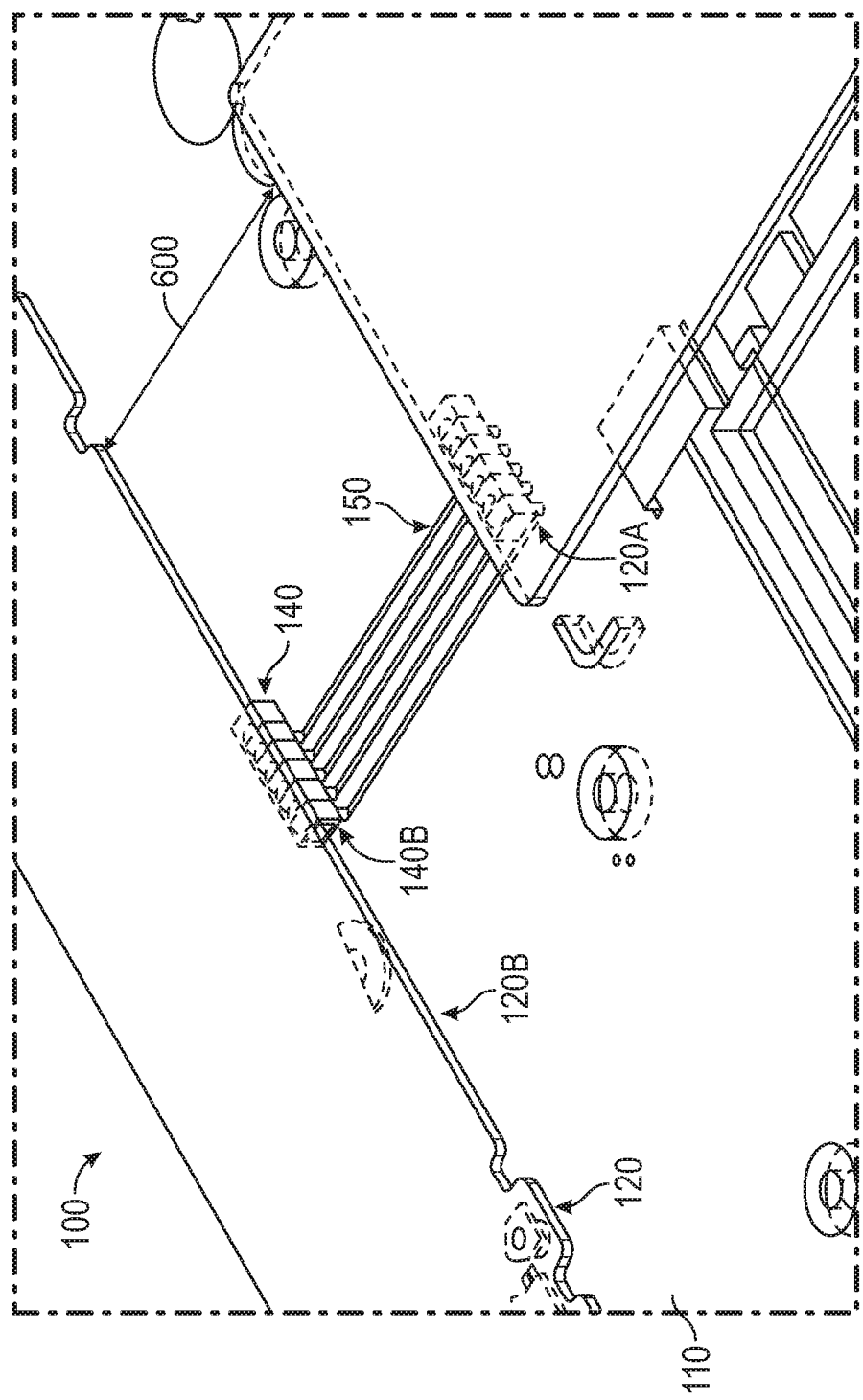
FIG. 6 illustrates a perspective view of the electronic device of FIG. 1.

FIG. 6 illustrates a perspective view of the electronic device 100 of FIG. 1. As described herein, the electronic device 100 may include the chassis 110, the electronic components 120, and the one or more electrical traces 150. The first electronic component 120A may be physically separated (e.g., spaced apart, detached, disconnected) from second electronic component 120B by a component gap 600. For instance, the first substrate 130A may be physically separated from the second substrate 130B by the component gap 600.

The electrical traces 150 may be sized and shaped to interface with the electronic components 120. For instance, the electrical traces may be sized and shaped to interface with the interconnects 140 of the electronic components 120. In an example, the interconnects 150 may be coupled to the chassis 150 and located in the component gap 600. For instance, the electrical traces 150 may at least partially overlap (or be contained within) a footprint of the component gap 600 between the electronic components 120. The electrical traces 150 may extend (e.g., span, link, connect, or the like) between the electronic components 120 (e.g., the components 120A. 120B).

The interconnects 140 may be included in the electronic components 120, and the interconnects 140 may help facilitate the electrical communication of the electronic components 120. For example, and as shown in FIG. 6, the electrical traces 150 may be sized and shaped to interface with interconnects 140 (e.g., the interconnects 140A. 140B) of the electronic components 120. The interfacing of the interconnects 140 with the electrical traces 150 may help establish an electrical circuit between the electronic components 120. In an example, the electronic component 120A may be in electrical communication with the electronic component 120B through the electrical traces 150 that are coupled to the chassis 110. The electrical traces 150 may help provide one or more electrically isolated channels (e.g., electrical communication pathways) between the electronic components 120.

Figure 7:
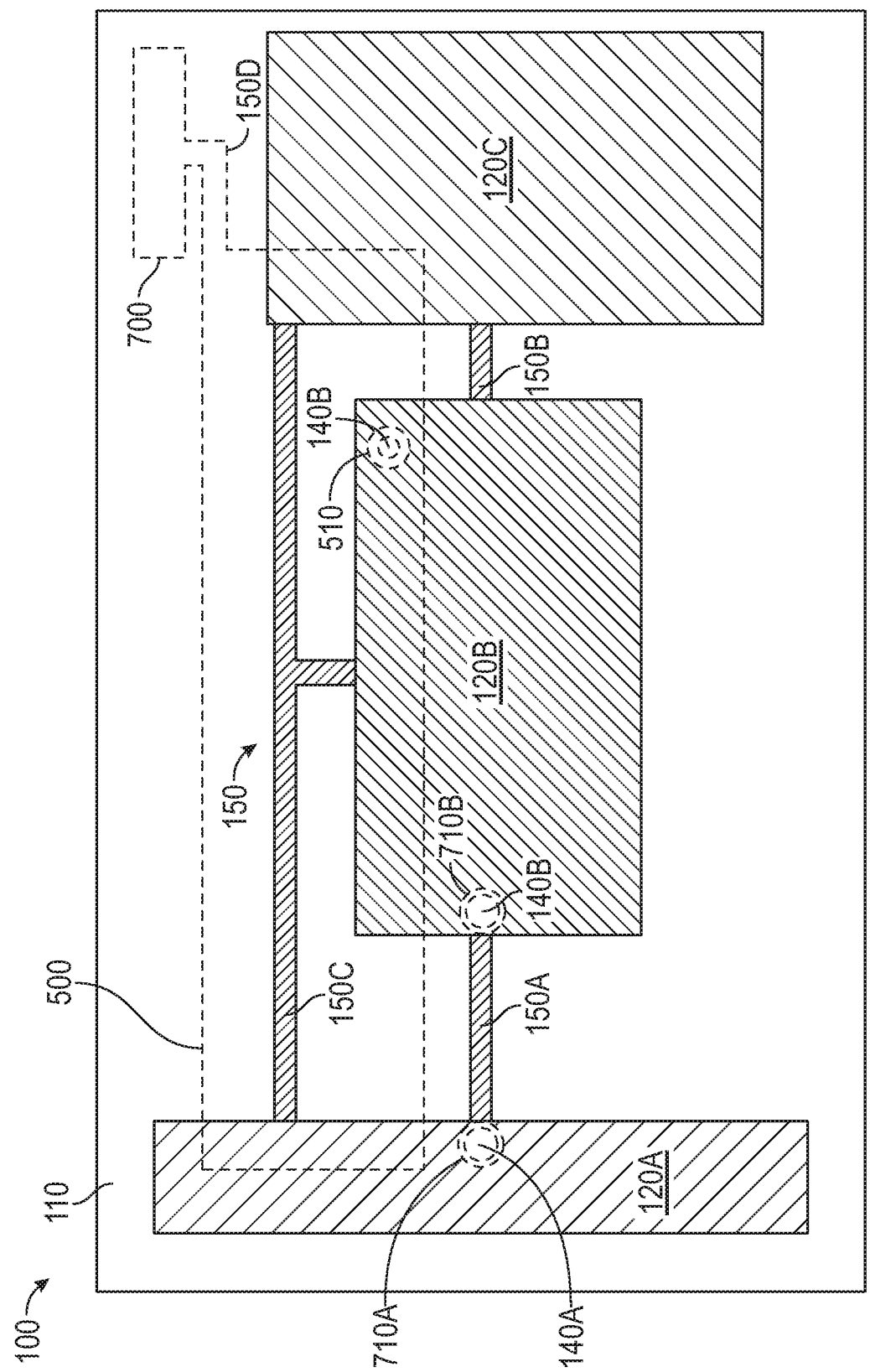
FIG. 7 illustrates a schematic view of another example of the electronic device, according to an embodiment of the present subject matter.

FIG. 7 illustrates a schematic view of another example of the electronic device 100, according to an embodiment of the present subject matter. As described herein, the electronic device 150 may include the electrical traces 150 (e.g., the traces 150A, 150B), and the electrical traces 150 may facilitate the electrical communication of the electronic components 120. In some examples, the electronic device 100 includes a third electrical trace 150C. The electrical trace 150C may facilitate the electrical communication of one or more of the electronic components 120. For example, the electrical trace 150C may be in electrical communication with the first electronic component 120A, the second electronic component 120B, and a third electronic component 120C. Accordingly, each of the electronic components 120A, 120B, 120C may be in electrical communication with each other through the electrical trace 150C coupled to the chassis 110 of the electronic device 100. For instance, the electronic component 120A may be in electrical communication with the electronic components 120B. 120C. The electronic components 120A. 120B, 120C may share the same channel (e.g., the same electrical communication pathway).

As described herein, the electronic device 100 may include the metallic layer 500 (e.g., as shown in FIG. 5), and the metallic layer 500 may be coupled to the chassis 110. The metallic layer 500 may be in electrical communication with a reference plane 700 (e.g., with a fourth electrical trace 150D). The reference plane 700 may be an electrical plane having a specified electrical characteristic, for instance a ground, a reference voltage, reference resistance, reference capacitance, or the like. The metallic layer 500 may be in electrical communication with the electronic component 120 through the reference plane 700 (e.g., the metallic layer 500 and the electronic components 120 may share the reference plane 700). For example, the interconnects 140 of the electronic components 120 (e.g., one or more of the interconnects 140B) may interface with metallic layer 500 through the reference interconnect 510. The reference plane 700 may be included in one or more of the electronic components 120 (e.g., within a layer of the substrate 130A of the electronic component 120A).

The electrical traces 150 may include one or more pads 710, for instance a first pad 710A and a second pad 710B. The first pad 710 may be located within a footprint of the electronic component 120A, and the first pad 710A may interface with one or more of the interconnects 140A. In an example, the electronic component 120A may be coupled to the chassis 110 (e.g., the first chassis component 110A, shown in FIG. 1) and one or more of the interconnects 140A may be in electrical communication with the pad 710A (e.g., by coupling a solder ball between the pad 710A and the interconnects 140A). The second pad 710B may be located within a footprint of the electronic component 120B, and the second pad 710 may be in electrical communication with one or more of the interconnects 140B.

Figure 8:
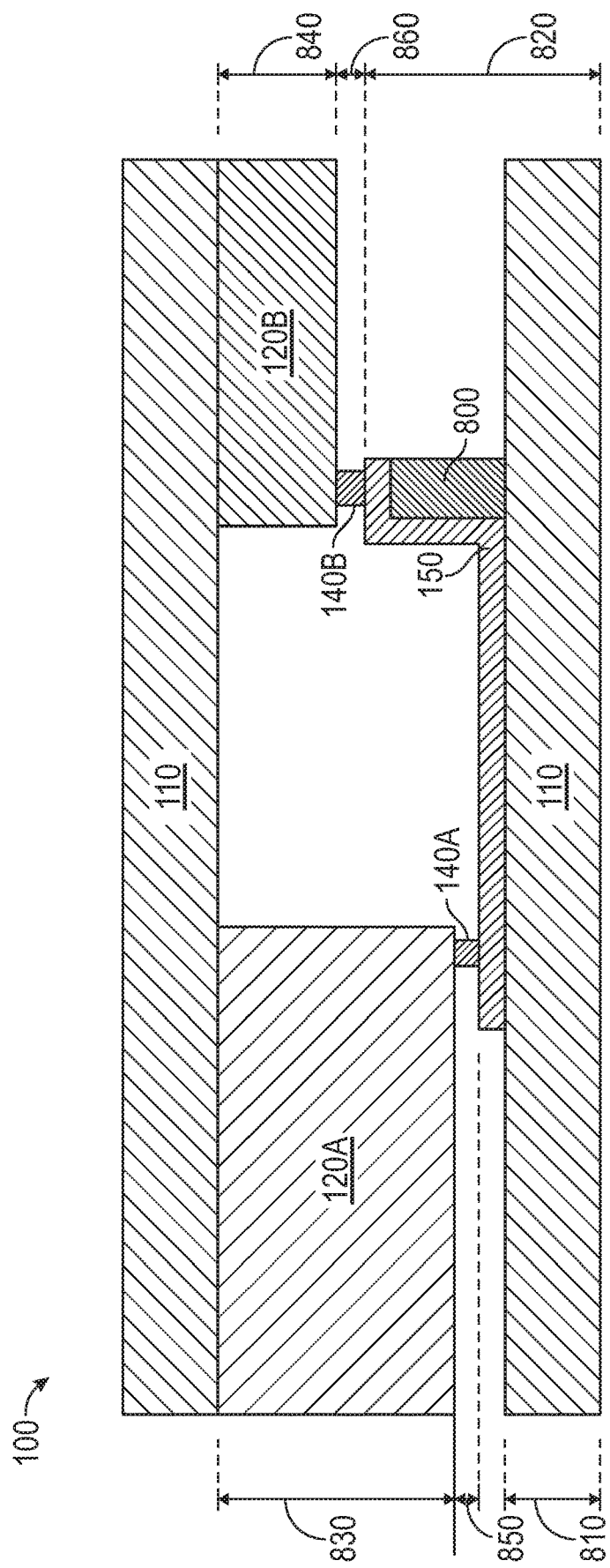
FIG. 8 illustrates a schematic view of yet another example of the electronic device, according to an embodiment of the present subject matter.

FIG. 8 illustrates a schematic view of yet another example of the electronic device 100, according to an embodiment of the present subject matter. In some examples, the electronic devices 120 have varying thicknesses, and the electrical traces 150 coupled to the chassis 110 may interface with the electronic components 120 that have varying thicknesses. In an example, the chassis 110 may include a boss 800 (e.g., a projection, tab, or the like), and the boss 800 may include a variation in a thickness of the chassis 110. For instance, the chassis 110 may have a first thickness 810, and the boss 800 of the chassis 110 may have a second thickness 820.

One or more of the electrical traces 150 may be coupled to the boss 800, and the boss 800 may locate the electrical traces 150 proximate to the electronic components 120 to help the electronic components 120 interface with the electrical traces 150. For instance, the electrical traces 150 may interface with the interconnects 140A of the first electronic component 120A having a third thickness 830. The electronic component 120B may have a fourth thickness 840, and the boss 800 may locate the trace 150 proximate to the interconnect 140B of the electronic component 120B to help facilitate the electrical communication between the electronic components 120A, 120B having varying thicknesses (e.g., the thicknesses 830, 840).

In some examples, the interconnects 140A has a fifth thickness 850, and the interconnects 140B have a sixth thickness 860. Accordingly, the interconnects 140A, 140B may help the electronic components 120A, 120B interface with the electrical traces 150 even though the electronic components 120A, 120B have varying thicknesses. In another example, the interconnects 140A, 140B of the electronic devices 120A, 120B may be offset (e.g., vertically) from each other, and the boss 800 may facilitate the interconnects 140A, 140B interfacing with the electrical traces 150.

Figure 9:
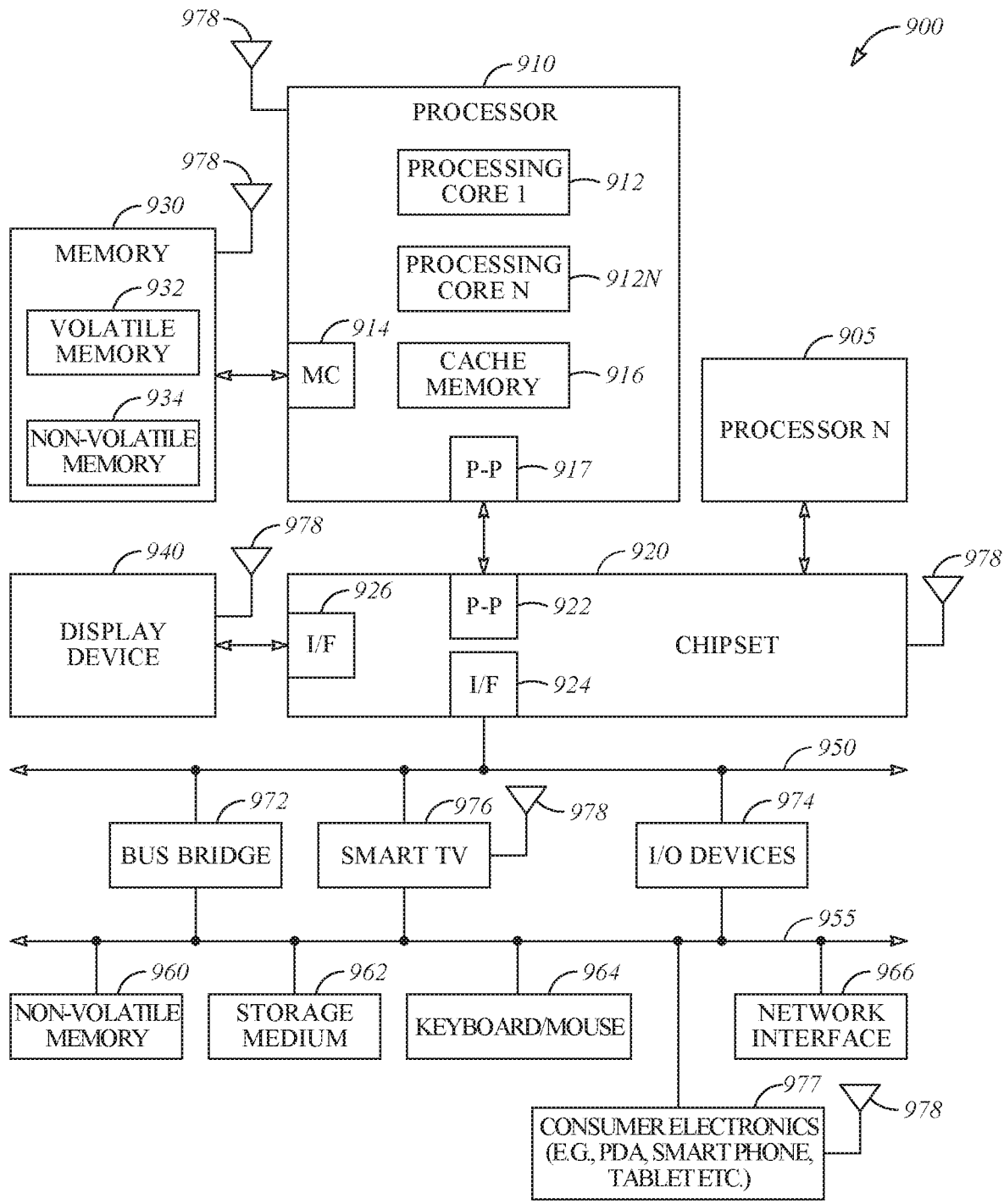
FIG. 9 illustrates a system level diagram, depicting an example of the electronic device

FIG. 9 illustrates a system level diagram, depicting the electronic device 100 (e.g., system) including one or more of the chassis 110, electronic components 120 and the electrical trace 150 coupled to the chassis 110 of the electronic device 100 as described in the present disclosure. FIG. 9 is included to show an example of a higher-level device application for one or more of the electronic device 100, the chassis 110, the electronic components 120, and the electrical trace 150 coupled to the chassis 110 of the electronic device 100. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 is a system on a chip (SOC) system.

In one embodiment, processor 910 has one or more processor cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, an interface for wireless antenna 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the example system, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices, including a bus bridge 972, a smart TV 976, I/O devices 974, nonvolatile memory 960, a storage medium (such as one or more mass storage devices) 962, a keyboard/mouse 964, a network interface 966, and various forms of consumer electronics 977 (such as a PDA, smart phone, tablet etc.), etc. In one embodiment, chipset 920 couples with these devices through an interface 924. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the example system, processor 910 and chipset 920 are merged into a single SOC. In addition, chipset 920 connects to one or more buses 950 and 955 that interconnect various system elements, such as I/O devices 974, nonvolatile memory 960, storage medium 962, a keyboard/mouse 964, and network interface 966. Buses 950 and 955 may be interconnected together via a bus bridge 972.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) may be incorporated into processor core 912.

Various Notes & Aspects

Aspect 1 may include or use subject matter (such as an apparatus, a system, a device, a method, a means for performing acts, or a device readable medium including instructions that, when performed by the device, may cause the device to perform acts), such as may include or use an electronic device comprising: a chassis; a first electronic component including a first substrate and a first interconnect; a second electronic component including a second substrate and a second interconnect, wherein the second substrate is physically separated from the first substrate; and an electrical trace coupled to the chassis of the electronic device, wherein: the electrical trace is sized and shaped to interface with the first interconnect of the first electronic component and the second interconnect of the second electronic component; and the first electronic component and the second electronic component are in electrical communication through the electrical trace coupled to the chassis of the electronic device.

Aspect 2 may include or use, or may optionally be combined with the subject matter of Aspect 1, to optionally include or use a dielectric layer coupled to the chassis, and the dielectric material is located between the electrical trace and the chassis.

Aspect 3 may include or use, or may optionally be combined with the subject matter of one or any combination of Aspects 1 or 2 to optionally include or use wherein the electrical trace is located in a component gap between the first substrate and the second substrate.

Aspect 4 may include or use, or may optionally be combined with the subject matter of one or any combination of Aspects 1 through 3 to optionally include or use the chassis includes a first chassis component and a second chassis component, and the second chassis component is selectively attachable to the first chassis component; the first electronic component and the second electronic component are included in the first chassis component; the electrical trace is coupled to the second chassis component; and the first electronic component and the second electronic component are in electrical communication through the electrical trace when the second chassis component is attached to the first chassis component.

Aspect 5 may include or use, or may optionally be combined with the subject matter of one or any combination of Aspects 1 through 4 to optionally include or use wherein the electrical trace defines a first pad and a second pad; the first pad is configured to interface with the first interconnect of the first electronic component; and the second pad is configured to interface with the second interconnect of the second electronic component.

Aspect 6 may include or use, or may optionally be combined with the subject matter of one or any combination of Aspects 1 through 5 to optionally include or use a metallic layer coupled to the chassis; a dielectric layer coupled to the metallic layer; and wherein the electrical trace is coupled to the dielectric layer.

Aspect 7 may include or use, or may optionally be combined with the subject matter of Aspect 6 to optionally include or use wherein the metallic layer is in electrical communication with a reference plane of the electronic device.

Aspect 8 may include or use, or may optionally be combined with the subject matter of one or any combination of Aspects 1 through 7 to optionally include or use wherein the trace projects from a surface of the chassis.

Aspect 9 may include or use, or may optionally be combined with the subject matter of one or any combination of Aspects 1 through 8 to optionally include or use wherein the trace is recessed within a portion of the chassis.

Aspect 10 may include or use, or may optionally be combined with the subject matter of one or any combination of Aspects 1 through 9 to optionally include or use wherein the first interconnect includes a fuzz button, a pogo pin, or a PC beam.

Aspect 11 may include or use, or may optionally be combined with the subject matter of one or any combination of Aspects 1 through 10 to optionally include or use wherein the chassis is sized and shaped to enclose the first electronic component and the second electronic component.

Aspect 12 may include or use, or may optionally be combined with the subject matter of one or any combination of Aspects 1 through 11 to optionally include or use wherein the electronic signals are digital electronic signals.

Aspect 13 may include or use subject matter (such as an apparatus, a system, a device, a method, a means for performing acts, or a device readable medium including instructions that, when performed by the device, may cause the device to perform acts), such as may include or use an electronic device comprising: a chassis; a first electronic component including a first interconnect; a second electronic component including a second interconnect, wherein the second electronic component is physically separated from the first electronic component; and a first electrical trace coupled to the chassis of the electronic device, wherein: the first electrical trace is sized and shaped to interface with the first interconnect of the first electronic component and the second interconnect of the second electronic component; and the first electronic component and the second electronic component are in electrical communication through the first electrical trace coupled to the chassis of the electronic device.

Aspect 14 may include or use, or may optionally be combined with the subject matter of Aspect 13, to optionally include or use wherein: the first electronic component includes one or more of a motherboard and a semiconductor device; and the second electronic component includes one or more of a display, a battery, a camera, an input device, and a network interface device.

Aspect 15 may include or use, or may optionally be combined with the subject matter of one or any combination of Aspects 13 or 14 to optionally include or use the first electronic component includes a first passive electrical component; and the second electronic component includes a second passive electrical component.

Aspect 16 may include or use, or may optionally be combined with the subject matter of one or any combination of Aspects 13 through 15 to optionally include or use wherein the first electrical trace is included in a plurality of electrical traces coupled to the chassis, and the plurality of electrical traces establish one or more electrically isolated channels between the first electronic component and the second electronic component.

Aspect 17 may include or use, or may optionally be combined with the subject matter of one or any combination of Aspects 13 through 16 to optionally include or use a second electrical trace coupled to the chassis and spaced apart from the first electrical trace at a first pitch.

Aspect 18 may include or use, or may optionally be combined with the subject matter of one or any combination of Aspects 13 through 17 to optionally include or use a third electronic component including a third interconnect; and a second electrical trace coupled to the chassis of the electronic device, wherein: the second electrical trace is sized and shaped to interface with the third interconnect of the third electronic device and one or more of the first interconnect of the first electronic component and the second interconnect of the second electronic component; and the third electronic component and one or more of the first electronic component and the second electronic component are in electrical communication through the second electrical trace coupled to the chassis of the electronic device.

Aspect 19 may include or use, or may optionally be combined with the subject matter of one or any combination of Aspects 13 through 18 to optionally include or use a metallic layer coupled to the chassis; a dielectric layer coupled to the metallic layer; and wherein the electrical trace is coupled to the dielectric layer and the metallic layer is in electrical communication with a reference plane of the electronic device.

Aspect 20 may include or use subject matter (such as an apparatus, a system, a device, a method, a means for performing acts, or a device readable medium including instructions that, when performed by the device, may cause the device to perform acts), such as may include or use an electronic device comprising: a chassis; and an electrical trace coupled to the chassis of the electronic device, wherein: the electrical trace is sized and shaped to interface with a first interconnect of a first electronic component and a second interconnect of a second electronic component; and the electrical trace is configured to transmit one or more electrical signals between the first electronic component and the second electronic component.

Aspect 21 may include or use, or may optionally be combined with the subject matter of Aspect 20, to optionally include or use a dielectric layer coupled to the chassis, and the dielectric material is located between the electrical trace and the chassis.

Aspect 22 may include or use, or may optionally be combined with the subject matter of Aspect 21 to optionally include or use a first metallic layer including one or more of copper and nickel coupled to the electrical trace; and a second metallic layer including gold coupled to the first metallic layer.

Aspect 23 may include or use, or may optionally be combined with the subject matter of one or any combination of Aspects 20 through 22 to optionally include or use the first electronic component and the second electronic component.

Aspect 24 may include or use, or may optionally be combined with the subject matter of one or any combination of Aspects 20 through 23 to optionally include or use a first metallic layer including one or more of copper and nickel coupled to the electrical trace; and a second metallic layer including gold coupled to the first metallic layer.

Each of these non-limiting aspects may stand on its own, or may be combined in various permutations or combinations with one or more of the other aspects.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B." "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular". "round", or "square", are not intended to require absolute mathematical precision, unless the context indicates otherwise. Instead, such geometric terms allow for variations due to manufacturing or equivalent functions. For example, if an element is described as "round" or "generally round." a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An electronic device comprising: a chassis; a first electronic component including a first substrate and a first interconnect; a second electronic component including a second substrate and a second interconnect, wherein the second substrate is physically separated from the first substrate; and an electrical trace coupled to the chassis of the electronic device, wherein: the electrical trace is sized and shaped to interface with the first interconnect of the first electronic component and the second interconnect of the second electronic component; and the first electronic component and the second electronic component are in electrical communication through the electrical trace coupled to the chassis of the electronic device, wherein: the chassis includes a first chassis component and a second chassis component, and the second chassis component is selectively attachable to the first chassis component; the first electronic component and the second electronic component are included in the first chassis component; the electrical trace is coupled to the second chassis component; and the first electronic component and the second electronic component are in electrical communication through the electrical trace when the second chassis component is attached to the first chassis component.

2. The electronic device of claim 1, further comprising a dielectric layer coupled to the chassis, and the dielectric material is located between the electrical trace and the chassis.

3. The electronic device of claim 1, wherein the electrical trace is located in a component gap between the first substrate and the second substrate.

4. The electronic device of claim 1, wherein:
the electrical trace defines a first pad and a second pad;
the first pad is configured to interface with the first interconnect of the first electronic component; and
the second pad is configured to interface with the second interconnect of the second electronic component.

5. The electronic device of claim 1, further comprising:
a metallic layer coupled to the chassis;
a dielectric layer coupled to the metallic layer; and
wherein the electrical trace is coupled to the dielectric layer.

6. The electronic device of claim 5, wherein the metallic layer is in electrical communication with a reference plane of the electronic device.

7. The electronic device of claim 1, wherein the trace projects from a surface of the chassis.

8. The electronic device of claim 1, wherein the trace is recessed within a portion of the chassis.

9. The electronic device of claim 1, wherein the first interconnect includes a fuzz button, a pogo pin, or a PC beam.

10. The electronic device of claim 1, wherein the chassis is sized and shaped to enclose the first electronic component and the second electronic component.

11. The electronic device of claim 1, wherein the electronic signals are digital electronic signals.

12. An electronic device comprising: a chassis; a first electronic component including a first interconnect; a second electronic component including a second interconnect, wherein the second electronic component is physically separated from the first electronic component; and a first electrical trace coupled to the chassis of the electronic device, wherein: the first electrical trace is sized and shaped to interface with the first interconnect of the first electronic component and the second interconnect of the second electronic component; and the first electronic component and the second electronic component are in electrical communication through the first electrical trace coupled to the chassis of the electronic device, further comprising: a third electronic component including a third interconnect; and a second electrical trace coupled to the chassis of the electronic device, wherein: the second electrical trace is sized and shaped to interface with the third interconnect of the third electronic device and one or more of the first interconnect of the first electronic component and the second interconnect of the second electronic component; and the third electronic component and one or more of the first electronic component and the second electronic component are in electrical communication through the second electrical trace coupled to the chassis of the electronic device.

13. The electronic device of claim 12, wherein:
the first electronic component includes one or more of a motherboard and a semiconductor device; and
the second electronic component includes one or more of a display, a battery, a camera, an input device, and a network interface device.

14. The electronic device of claim 12, wherein:
the first electronic component includes a first passive electrical component; and the second electronic component includes a second passive electrical component.

15. The electronic device of claim 12, wherein the first electrical trace is included in a plurality of electrical traces coupled to the chassis, and the plurality of electrical traces establish one or more electrically isolated channels between the first electronic component and the second electronic component.

16. The electronic device of claim 12, further comprising a second electrical trace coupled to the chassis and spaced apart from the first electrical trace at a first pitch.

17. The electronic device of claim 12, further comprising:
a metallic layer coupled to the chassis;
a dielectric layer coupled to the metallic layer; and
wherein the electrical trace is coupled to the dielectric layer and the metallic layer is in electrical communication with a reference plane of the electronic device.

18. An electronic device comprising: a chassis; and an electrical trace coupled to the chassis of the electronic device, wherein: the electrical trace is sized and shaped to interface with a first interconnect of a first electronic component and a second interconnect of a second electronic component; and the electrical trace is configured to transmit one or more electrical signals between the first electronic component and the second electronic component, further comprising a dielectric layer coupled to the chassis, and the dielectric material is located between the electrical trace and the chassis.

19. The electronic device of claim 18, further comprising:
a first metallic layer including one or more of copper and nickel coupled to the electrical trace; and
a second metallic layer including gold coupled to the first metallic layer.

20. The electronic device of claim 18, further comprising the first electronic component and the second electronic component.

21. The electronic device of claim 18, further comprising:
a first metallic layer including one or more of copper and nickel coupled to the electrical trace; and
a second metallic layer including gold coupled to the first metallic layer.

* * * * *